(12) United States Patent
Mimura et al.

(10) Patent No.: US 11,063,573 B2
(45) Date of Patent: Jul. 13, 2021

(54) QUARTZ CRYSTAL RESONATOR AND QUARTZ CRYSTAL RESONATOR UNIT

(71) Applicant: Murata Manufacturing Co., Ltd., Nagaokakyo (JP)

(72) Inventors: Kazuhiro Mimura, Nagaokakyo (JP); Tadashi Yoda, Nagaokakyo (JP); Koki Sai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 444 days.

(21) Appl. No.: 16/212,891

(22) Filed: Dec. 7, 2018

(65) Prior Publication Data
US 2019/0109577 A1    Apr. 11, 2019

Related U.S. Application Data

(63) Continuation of application No. PCT/JP2017/019063, filed on May 22, 2017.

(30) Foreign Application Priority Data

Jun. 23, 2016    (JP) .............................. JP2016-124624

(51) Int. Cl.
| | | |
|---|---|---|
| *H03H 9/02* | (2006.01) | |
| *H03H 9/19* | (2006.01) | |
| *H03H 9/10* | (2006.01) | |
| *H03H 9/13* | (2006.01) | |

(52) U.S. Cl.
CPC .... *H03H 9/02133* (2013.01); *H03H 9/02023* (2013.01); *H03H 9/02157* (2013.01); *H03H 9/1021* (2013.01); *H03H 9/132* (2013.01); *H03H 9/19* (2013.01)

(58) Field of Classification Search
CPC ........... H03H 9/02133; H03H 9/02157; H03H 9/02023; H03H 9/1021; H03H 9/132; H03H 9/19
See application file for complete search history.

(56) References Cited

U.S. PATENT DOCUMENTS

2017/0250670 A1*    8/2017 Goto ...................... H03H 9/177

FOREIGN PATENT DOCUMENTS

| JP | 2007243681 A | 9/2007 |
|---|---|---|
| JP | 2010135890 A | 6/2010 |
| JP | 2012134824 A | 7/2012 |
| JP | 2013017103 A | 1/2013 |

OTHER PUBLICATIONS

International Search Report issued for PCT/JP2017/019063, dated Jul. 25, 2017.
Written Opinion of the International Searching Authority issued in PCT/JP2017/019063, dated Jul. 25, 2017.

* cited by examiner

*Primary Examiner* — Jeffrey M Shin
(74) *Attorney, Agent, or Firm* — Arent Fox LLP

(57) ABSTRACT

A quartz crystal resonator that includes a substrate including a vibration portion, a frame portion that surrounds the vibration portion, and first to fourth coupling portions that couple the vibration portion and the frame portion to each other; and first and second excitation electrodes. An intersecting point of diagonal lines of a quadrangle formed by first to fourth connection portions is located on the positive side of the z axis relative to the x axis.

20 Claims, 9 Drawing Sheets

FIG. 8 – PRIOR ART
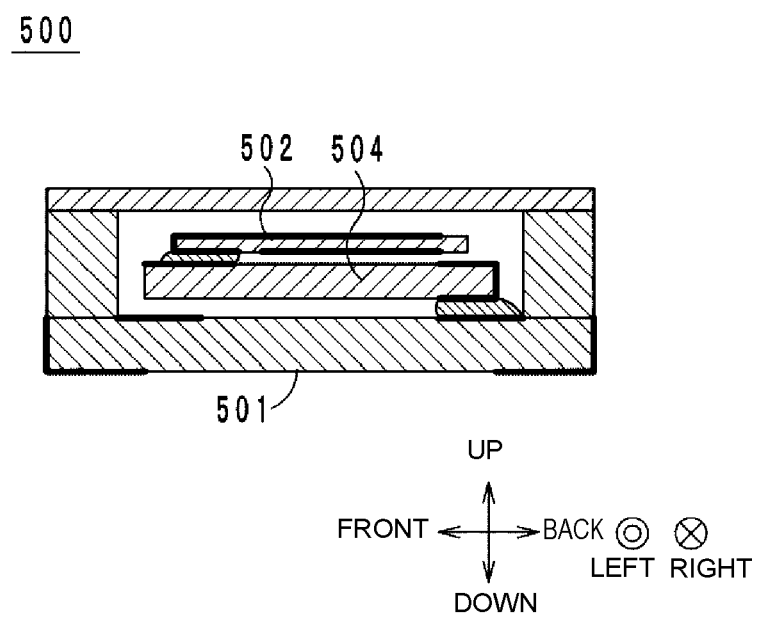

FIG. 9 – PRIOR ART
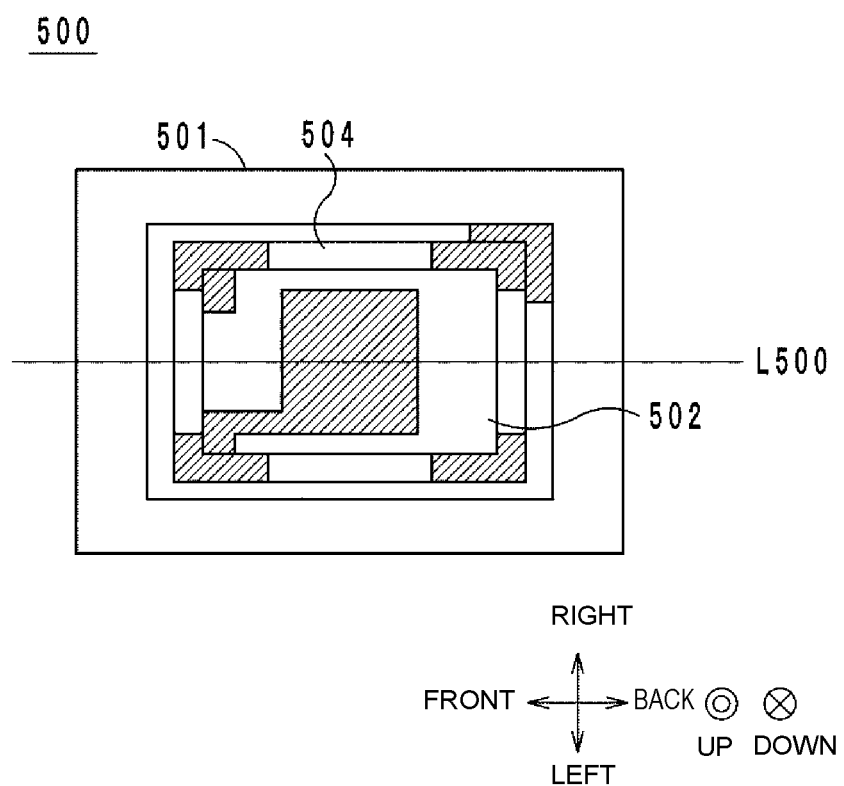

US 11,063,573 B2

QUARTZ CRYSTAL RESONATOR AND QUARTZ CRYSTAL RESONATOR UNIT

CROSS REFERENCE TO RELATED APPLICATIONS

The present application is a continuation of International application No. PCT/JP2017/019063, filed May 22, 2017, which claims priority to Japanese Patent Application No. 2016-124624, filed Jun. 23, 2016, the entire contents of each of which are incorporated herein by reference.

FIELD OF THE INVENTION

The present invention relates to a quartz crystal resonator and a quartz crystal resonator unit, and, in particular, to a quartz crystal resonator and a quartz crystal resonator unit having a structure in which both main surfaces of a quartz crystal plate are sandwiched between a pair of excitation electrodes.

BACKGROUND OF THE INVENTION

A quartz crystal device described in Patent Document 1 is known as an example of existing inventions related to a quartz crystal resonator. FIG. 8 is a sectional view of a quartz crystal device 500 described in Patent Document 1. FIG. 9 is a top view of the quartz crystal device 500 described in Patent Document 1. Hereinafter, the up-down direction, the left-right direction, and the front-back direction of the quartz crystal device 500 are defined as shown in FIG. 8.

The quartz crystal device 500 includes a package body 501, a quartz crystal resonator 502, and a base 504. The quartz crystal resonator 502 is mounted on an upper surface of the base 504 at a front end thereof. The base 504 is mounted on an upper surface of a bottom portion of the package body 501 at a back end thereof. Thus, a joint between the quartz crystal resonator 502 and the base 504 and a joint between the package body 501 and the base 504 are separated from each other. Therefore, even when a strain occurs at the back end of the base 504 due to a difference in linear expansion coefficient between the package body 501 and the base 504, the strain is not likely to be transferred through the base 504 to reach the joint between the quartz crystal resonator 502 and the base 504. Thus, the negative effect of the difference in thermal expansion coefficient is avoided.

Patent Document 1: Japanese Unexamined Patent Application Publication No. 2010-135890

Patent Document 2: Japanese Unexamined Patent Application Publication No. 2012-134824

SUMMARY OF THE INVENTION

However, the quartz crystal device 500 described in Patent Document 1 has a problem in that the excitation frequency varies when an impact is applied from the outside of the quartz crystal device 500. To be more specific, when an impact is applied to the quartz crystal device 500, the impact is transmitted from the base 504 to the quartz crystal resonator 502 via the joint between the quartz crystal resonator 502 and the base 504.

In the quartz crystal device 500, as illustrated in FIG. 9, when viewed from above, the quartz crystal resonator 502, and outer electrodes and excitation electrodes, which are disposed on the quartz crystal resonator 502, each have a structure that is line-symmetric with respect to a straight line L500. The straight line L500 is a straight line that passes through the intersecting point of the diagonal lines of the quartz crystal resonator 502 and that extends in the front-back direction when viewed from above. Therefore, the quartz crystal resonator 502 is joined to the base 504 at a position such that the quartz crystal resonator 502 is line-symmetric with respect to the straight line L500. Accordingly, a stress due to an impact is large on the straight line L500, which is at the middle of the joint. Because the center of each excitation electrode is located on the straight line L500, a large stress is applied to the center of the excitation electrode. As a result, the excitation frequency of the quartz crystal device 500 varies. Also when a thermal shock is applied to the quartz crystal device 500, the excitation frequency of the quartz crystal device 500 varies for the same reason as in the case where an impact is applied to the quartz crystal device 500.

A resonator described in Patent Document 2 also has a line-symmetric structure similar to that of the quartz crystal resonator 502. Therefore, the resonator described in Patent Document 2 also has a problem in that the excitation frequency varies when an impact or a thermal shock is applied from the outside, as with the quartz crystal device 500.

An object of the present invention is to provide a quartz crystal resonator and a quartz crystal resonator unit that can suppress variation of the excitation frequency.

According to an embodiment of the present invention, a quartz crystal resonator includes a substrate having a first main surface and a second main surface, the substrate including a vibration portion that is a quartz crystal plate, a frame portion that is separated from the vibration portion and surrounds the vibration portion when viewed in a normal direction that is normal to the first main surface, and first to fourth coupling portions that couple the vibration portion and the frame portion to each other; a first excitation electrode on the first main surface in the vibration portion; and a second excitation electrode on the second main surface in the vibration portion. The first main surface of the vibration portion has a rectangular shape having a first edge, a second edge, a third edge, and a fourth edge, the third and fourth edges being perpendicular to the first and second edges when viewed in the normal direction. An intersecting point of diagonal lines of the first main surface of the vibration portion when viewed in the normal direction is defined as an origin. A straight line that passes through the origin, that is parallel to the first edge, and that has a positive side on which the third edge is located is defined as a z axis. A straight line that passes through the origin, that is parallel to the third edge, and that has a positive side on which the second edge is located is defined as an x axis. The first coupling portion couples the vibration portion and the frame portion in a region on the positive side of the z axis and the negative side of the x axis when viewed in the normal direction. The second coupling portion couples the vibration portion and the frame portion in a region on the positive side of the z axis and the positive side of the x axis when viewed in the normal direction. The third coupling portion couples the vibration portion and the frame portion in a region on the negative side of the z axis and the positive side of the x axis when viewed in the normal direction. The fourth coupling portion couples the vibration portion and the frame portion in a region on the negative side of the z axis and the negative side of the x axis when viewed in the normal direction. Portions where the first to fourth coupling portions are respectively connected to the vibration portion are defined as first to fourth connection portions. An intersecting point of diagonal lines of a quadrangle formed by the first to fourth connection portions is located on the positive side or the negative side of the z axis relative to the x axis when viewed in the normal direction, or, the intersecting point of the diagonal lines of the quadrangle formed by the first to fourth connection portions is located on the positive side or the negative side of the x axis relative to the z axis when viewed in the normal direction.

According to an embodiment of the present invention, a quartz crystal resonator unit includes the quartz crystal resonator, a mount substrate that has a third main surface and a fourth main surface and on which the quartz crystal resonator is mounted so that the second main surface and the third main surface face each other, and a cap that covers the third main surface.

With the present invention, variation of the excitation frequency can be suppressed.

BRIEF DESCRIPTION OF THE DRAWINGS

FIG. 5 is a top view of a quartz crystal resonator 13a.
FIG. 8 is a sectional view of a quartz crystal device 500 described in Patent Document 1.
FIG. 9 is a top view of the quartz crystal device 500 described in Patent Document 1.

DETAILED DESCRIPTION OF THE PREFERRED EMBODIMENTS (Embodiment)

Figure 1:
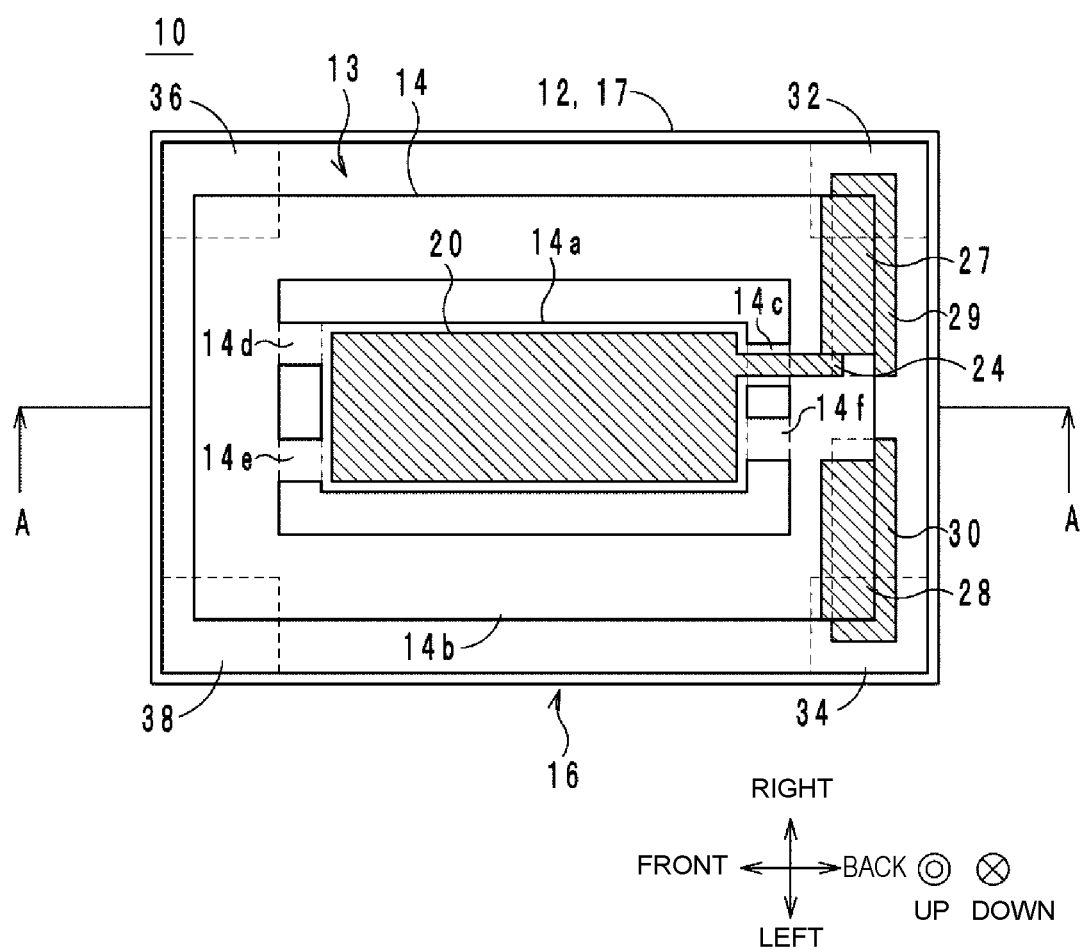
FIG. 1 is a top view of a quartz crystal resonator unit 10.
Figure 2:
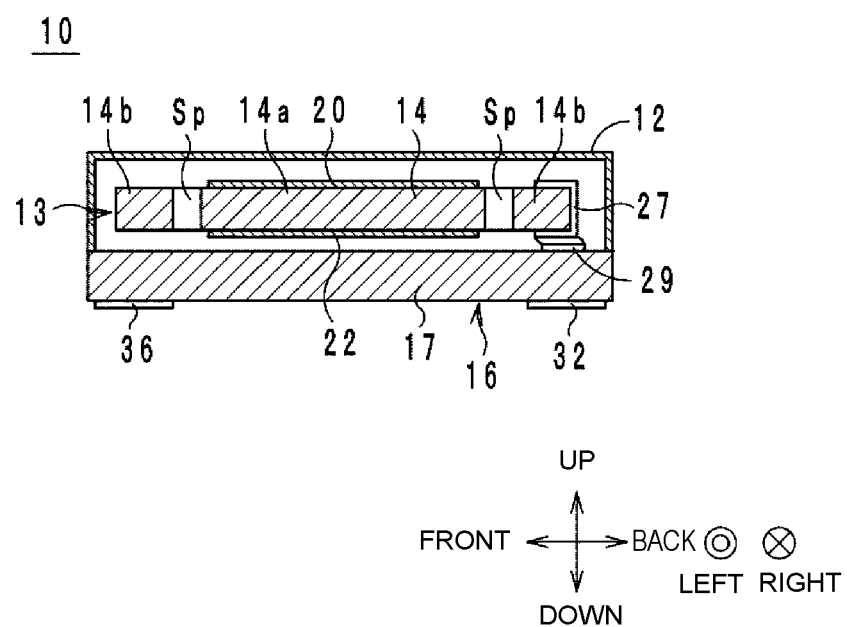
FIG. 2 is a sectional view of the quartz crystal resonator unit 10 taken along line A-A in FIG. 1.
Figure 3:
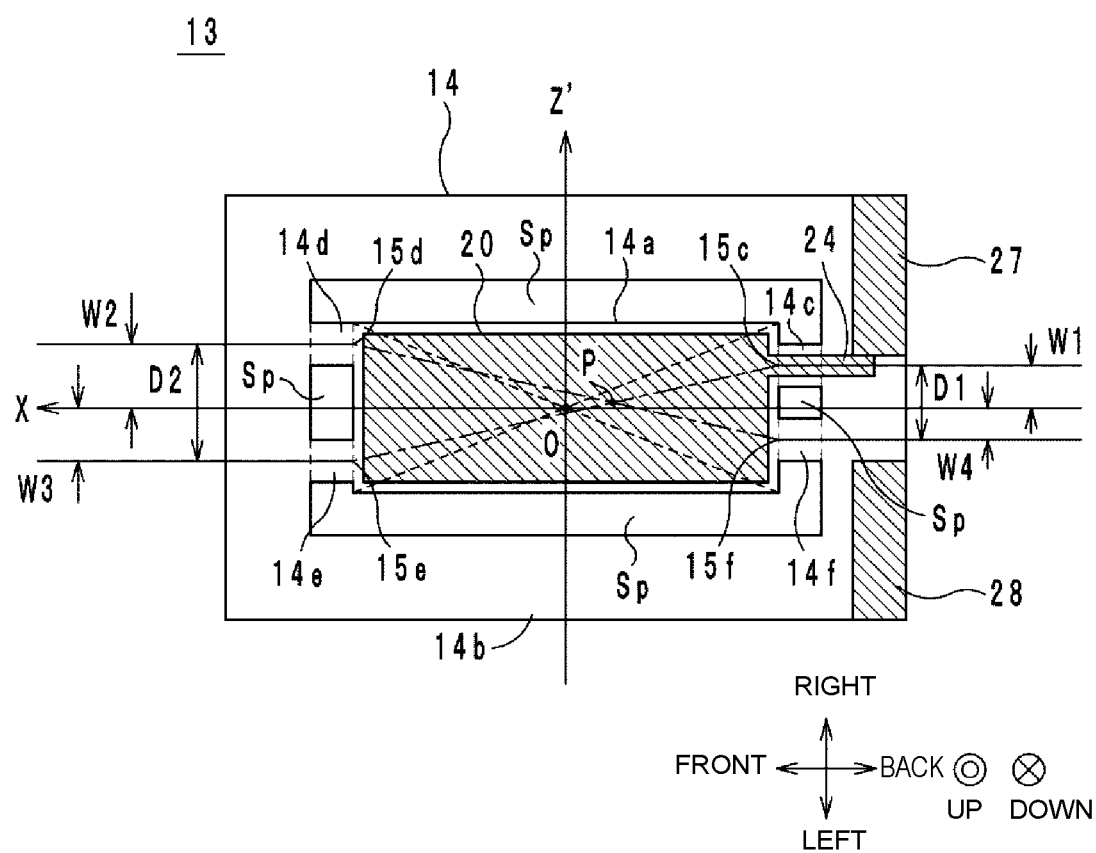
FIG. 3 is a top view of a quartz crystal resonator 13.
Figure 4:
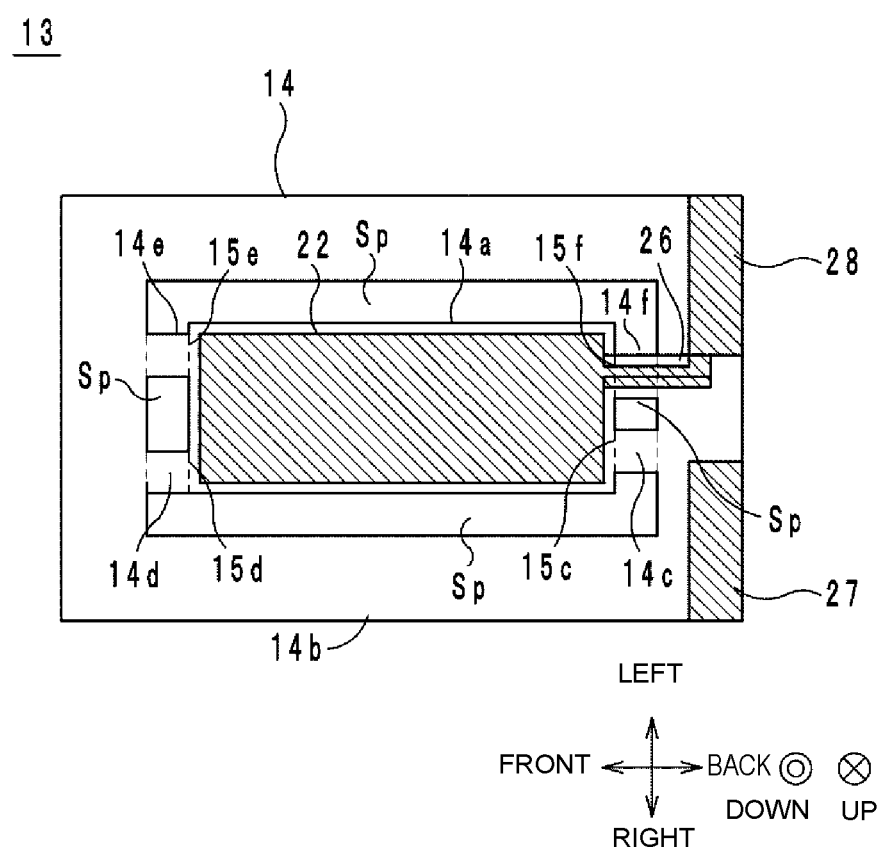
FIG. 4 is a bottom view of the quartz crystal resonator 13.

Hereinafter, a quartz crystal resonator unit 10 including a quartz crystal resonator 13 according to an embodiment will be described with reference to the drawings. FIG. 1 is a top view of the quartz crystal resonator unit 10. In FIG. 1, an upper surface of a cap 12 is omitted. FIG. 2 is a sectional view of the quartz crystal resonator unit 10 taken along line A-A in FIG. 1. FIG. 3 is a top view of the quartz crystal resonator 13. FIG. 4 is a bottom view of the quartz crystal resonator 13.

Hereinafter, a normal direction that is normal to an upper surface of a quartz crystal blank 14 of the quartz crystal resonator 13 is defined as the up-down direction. When viewed from above, the direction parallel to the long edges of the quartz crystal blank 14 is defined as the front-back direction, and the direction parallel to the short edges of the quartz crystal blank 14 is defined as the left-right direction. However, the up-down direction, the front-back direction, and the left-right direction are examples and need not coincide with the up-down direction, the front-back direction, and the left-right direction when the quartz crystal resonator unit 10 is actually used.

As illustrated in FIGS. 1 and 2, the quartz crystal resonator unit 10 includes the cap 12, the quartz crystal resonator 13, and a mount substrate 16. As illustrated in FIGS. 3 and 4, the quartz crystal resonator 13 includes the quartz crystal blank 14, excitation electrodes 20 and 22, extension electrodes 24 and 26, and outer electrodes 27 and 28.

The quartz crystal blank 14 (an example of a substrate) is a quartz crystal plate having an upper surface (an example of a first main surface) and a lower surface (an example of a second main surface). When viewed from above, the upper surface of the quartz crystal blank 14 has a rectangular shape having long edges extending in the front-back direction. The quartz crystal blank 14 is, for example, an AT-cut quartz crystal blank that is cut from a rough quartz crystal at a predetermined angle. When the crystal axes of a synthetic quartz crystal are referred to as the X, Y, and Z axes, the Y' axis and the Z' axis are defined as axes that are obtained by rotating the Y axis and the Z axis by 35 degrees 15 minutes±1 minute 30 seconds around the X axis in the direction from the Y axis toward the Z axis. The AT-cut quartz crystal blank 14 is cut so that a surface (XZ' surface) parallel to a plane specified by the X axis and the Z' axis is a main surface thereof.

In the present embodiment, regarding the AT-cut rectangular quartz crystal blank 14, the direction of the X axis (an example of an x axis) is defined as the front-back direction, the direction of the Z' axis (an example of a z axis) is defined as the left-right direction, and the direction of the Y axis is defined as the up-down direction. When viewed from above, the origin O of the X axis and the Z' axis is the intersecting point of the diagonal lines of a vibration portion 14a described below. The front side is the positive side of the X axis, and the back side is the negative side of the X axis. The right side is the positive side of the Z' axis, and the left side is the negative side of the Z' axis.

The quartz crystal blank 14 includes the vibration portion 14a, a frame portion 14b, and coupling portions 14c to 14f, and is a single quartz crystal plate. The vibration portion 14a vibrates at a predetermined frequency. When viewed from above, the upper surface of the vibration portion 14a has a rectangular shape having a short edge located on the back side (an example of a first edge), a short edge located on the front side (an example of a second edge), a long edge located on the right side (an example of a third edge), and a long edge located on the left side (an example of a fourth edge).

When viewed from above, the frame portion 14b is separated from the vibration portion 14a and surrounds the vibration portion 14a. That is, when viewed from above, the frame portion 14b has a rectangular frame-like shape. The frame portion 14b is not completely connected to the vibration portion 14a. A space Sp exists between the vibration portion 14a and the frame portion 14b. The frame portion 14b has a thickness larger than or equal to the thickness of the vibration portion 14a. In the present embodiment, the thickness of the frame portion 14b is substantially the same as the thickness of the vibration portion 14a. Hereinafter, the term "thickness" refers to a thickness in the up-down direction. The upper surface of the frame portion 14b and the upper surface of the vibration portion 14a are preferably located at substantially the same height in the up-down direction. The lower surface of the frame portion 14b and the lower surface of the vibration portion 14a are preferably located at substantially the same height in the up-down direction.

The coupling portions 14c to 14f couple the vibration portion 14a and the frame portion 14b to each other. Hereinafter, portions where the coupling portions 14c to 14f are connected to the vibration portion 14a will be respectively referred to as connection portions 15c to 15f. When viewed from above, the coupling portion 14c (an example of a first coupling portion) couples the vibration portion 14a and the frame portion 14b in a region on the positive side of the Z' axis and the negative side of the X axis. To be more specific, when viewed from above, the connection portion 15c (an example of a first connection portion) is located in a right-half region of the short edge of the vibration portion 14a on the back side. When viewed from above, the distance between the center of the connection portion 15c and the X axis in the left-right direction is denoted by W1. Hereinafter, when viewed from above, the distance between the center of a connection portion and the X axis in the left-right direction will be simply referred to as the distance between the connection portion and the X axis. When viewed from above, the coupling portion 14c linearly extends backward from the connection portion 15c. The back end of the coupling portion 14c is connected to a short edge of an inner periphery of the frame portion 14b on the back side.

When viewed from above, the coupling portion 14d (an example of a second coupling portion) couples the vibration portion 14a and the frame portion 14b in a region on the positive side of the Z' axis and the positive side of the X axis. To be more specific, when viewed from above, the connection portion 15d (an example of a second connection portion) is located in a right-half region of the short edge of the vibration portion 14a on the front side. When viewed from above, the distance between the connection portion 15d and the X axis is denoted by W2. When viewed from above, the coupling portion 14d linearly extends forward from the connection portion 15d. The front end of the coupling portion 14d is connected to a short edge of the inner periphery of the frame portion 14b on the front side.

When viewed from above, the coupling portion 14e (an example of a third coupling portion) couples the vibration portion 14a and the frame portion 14b in a region on the negative side of the Z' axis and the positive side of the X axis. To be more specific, when viewed from above, the connection portion 15e (an example of a third connection portion) is located in a left-half region of the short edge of the vibration portion 14a on the front side. When viewed from above, the distance between the connection portion 15e and the X axis denoted by W3. When viewed from above, the coupling portion 14e linearly extends forward from the connection portion 15e. The front end of the coupling portion 14e is connected to the short edge of the inner periphery of the frame portion 14b on the front side.

When viewed from above, the coupling portion 14f (an example of a fourth coupling portion) couples the vibration portion 14a and the frame portion 14b in a region on the negative side of the Z' axis and the negative side of the X axis. To be more specific, when viewed from above, the connection portion 15f (an example of a fourth connection portion) is located in a left-half region of the short edge of the vibration portion 14a on the back side. When viewed from above, the distance between the connection portion 15f and the X axis is denoted by W4. When viewed from above, the coupling portion 14f linearly extends backward from the connection portion 15f. The back end of the coupling portion 14f is connected to the short edge of the inner periphery of the frame portion 14b on the back side.

In the quartz crystal resonator 13, preferably W1≠W4 and W2≠W3, and, most preferably, W1>W4 and W2>W3. However, at least one of W1≠W4 and W2≠W3 is most preferred.

When viewed from above, the distance between the center of the connection portion 15c in the left-right direction and the center of the connection portion 15f in the left-right direction is denoted by D1. Hereinafter, the distance between the center of a connection portion in the left-right direction and the center of a connection portion in the left-right direction will be simply referred to as the distance between the connection portions. The distance between the connection portion 15d and the connection portion 15e is denoted by D2. In the quartz crystal resonator 13, D1≠D2 is satisfied, and, preferably, D1<D2 is satisfied. However, D1>D2 may be satisfied.

As described above, because D1<D2 is satisfied, the intersecting point P of the diagonal lines of a quadrangle that is formed by the centers of the connection portions 15c to 15f in the left-right direction is located on the negative side of the X axis (back side) relative to the Z' axis. Alternatively, D1>D2 may be satisfied. In this case, the intersecting point P is located on the positive side of the X axis (left side) relative to the Z' axis. Because W3/W2<W4/W1 is satisfied, the intersecting point P is located on the positive side (right side) of the Z' axis relative to the X axis. Alternatively, W3/W2>W4/W1 may be satisfied. In this case, the intersecting point P is located on the negative side (left side) of the Z' axis relative to the X axis.

The excitation electrode 20 (an example of a first excitation electrode) is a conductor layer disposed on the upper surface of the vibration portion 14a. When viewed from above, the excitation electrode 20 has a rectangular shape having long edges extending in the front-back direction. The excitation electrode 22 (an example of a second excitation electrode) is a conductor layer disposed on the lower surface of the vibration portion 14a. When viewed from below, the excitation electrode 22 has a rectangular shape having long edges extending in the front-back direction. Thus, the excitation electrode 20 and the excitation electrode 22 sandwich the vibration portion 14a in the up-down direction. When viewed from above, the intersecting point of the diagonal lines of each of the excitation electrodes 20 and 22 coincides with the origin O.

The outer electrode 27 (an example of a first outer electrode) is disposed on the upper surface, the back surface, and the lower surface of the quartz crystal blank (to be more precise, the frame portion 14b). To be more specific, when viewed from above, the outer electrode 27 has a rectangular shape that is in contact with the right-back corner of the upper surface of the quartz crystal blank 14. When viewed from below, the outer electrode 27 has a rectangular shape that is in contact with the right-back corner of the lower surface of the quartz crystal blank 14. A portion of the outer electrode 27 located on the back surface of the quartz crystal blank 14 connects a portion of the outer electrode 27 disposed on the upper surface of the quartz crystal blank 14 and a portion of the outer electrode 27 disposed on the lower surface of the quartz crystal blank 14 to each other. Thus, when viewed from the left side, the outer electrode 27 has an angular U-shape.

The outer electrode 28 (an example of a second outer electrode) is disposed on the upper surface, the back surface, and the lower surface of the quartz crystal blank (to be more precise, the frame portion 14b). To be more specific, when viewed from above, the outer electrode 28 has a rectangular shape that is in contact with the left-back corner of the upper surface of the quartz crystal blank 14. When viewed from below, the outer electrode 28 has a rectangular shape that is in contact with the left-back corner of the lower surface of the quartz crystal blank 14. A portion of the outer electrode 28 located on the back surface of the quartz crystal blank 14 connects a portion of the outer electrode 28 disposed on the upper surface of the quartz crystal blank 14 and a portion of the outer electrode 28 disposed on the lower surface of the quartz crystal blank 14 to each other. Thus, when viewed from the left side, the outer electrode 28 has an angular U-shape. For example, each of the outer electrodes 27 and 28 has a structure such that an Au layer is formed on a Cr underlying layer by plating.

The extension electrode 24 (an example of a first extension electrode) is a linear conductor layer that is disposed on the upper surface of the quartz crystal blank 14 and that has a front end (an example of a first end portion) and a back end (an example of second end portion). The extension electrode 24 passes through one of the coupling portions 14c to 14f (the coupling portion 14c, in the case of the quartz crystal resonator 13), thereby being connected to the excitation electrode 20 at the front end thereof and being electrically connected to the outer electrode 27 at the back end thereof.

The extension electrode 26 (an example of a second extension electrode) is a linear conductor layer that is disposed on the lower surface of the quartz crystal blank 14 and that has a front end (an example of a third end portion) and a back end (an example of fourth end portion). The extension electrode 26 passes through one of the coupling portions 14c to 14f (the coupling portion 14f, in the case of the quartz crystal resonator 13), thereby being connected to the excitation electrode 22 at the front end thereof and being electrically connected to the outer electrode 28 at the back end thereof. For example, each of the excitation electrodes 20 and 22 and the extension electrodes 24 and 26 has a structure such that an Au layer is formed on a Cr underlying layer by plating.

As illustrated in FIGS. 1 and 2, the mount substrate 16 includes a substrate body 17; mount electrodes 29 and 30; and outer electrodes 32, 34, 36, and 38. When viewed from above, the substrate body 17 is a flat plate having a rectangular shape having long edges extending in the front-back direction. The substrate body 17 has an upper surface (an example of a third main surface) and a lower surface (an example of a fourth main surface). Examples of the material of the substrate body 17 include ceramic insulating materials, such as an aluminum oxide sintered compact, a mullite sintered compact, an aluminum nitride sintered compact, a silicon carbide sintered compact, and a glass-ceramic sintered compact; quartz crystal; glass; silicon; and the like.

The mount electrode 29 is a rectangular conductor that is disposed on the upper surface of the substrate body 17 near the right-back corner of the upper surface when viewed from above. The mount electrode 30 is a rectangular conductor that is disposed on the upper surface of the substrate body 17 near the left-back corner of the upper surface when viewed from above.

The outer electrode 32 is a rectangular conductor that is disposed on the lower surface of the substrate body 17 so as to be adjacent to the right-back corner of the substrate body 17 when viewed from below. The outer electrode 34 is a rectangular conductor that is disposed on the lower surface of the substrate body 17 so as to be adjacent to the left-back corner of the substrate body 17 when viewed from below. The outer electrode 36 is a rectangular conductor that is disposed on the lower surface of the substrate body 17 so as to be adjacent to the right-front corner of the substrate body 17 when viewed from below. The outer electrode 38 is a rectangular conductor that is disposed on the lower surface of the substrate body 17 so as to be adjacent to the left-front corner of the substrate body 17 when viewed from below. For example, each of the mount electrodes 29 and 30 and the outer electrodes 32, 34, 36, and 38 has a structure such that an Au layer is formed on a Cr underlying layer by plating.

The mount electrode 29 and the outer electrode 32 are connected to each other via a via-hole conductor (not shown). The mount electrode 30 and the outer electrode 34 are connected to each other via a via-hole conductor (not shown).

The quartz crystal resonator 13 is mounted on the mount substrate 16 so that the lower surface of the quartz crystal resonator 13 and the upper surface of the substrate body 17 face each other. To be specific, the outer electrodes 27 and 28 are respectively connected to the mount electrodes 29 and 30 by soldering or the like.

The cap 12 is a rectangular box-shaped (that is, hollow) housing. When viewed from above, the shape of the cap 12 substantially coincides with the shape of the upper surface of the mount substrate 16. The lower side of the cap 12 is open. The cap 12 is fixed to the upper surface of the quartz crystal blank 14 by joining the outer edge of the opening of the cap 12 to a joining member (not shown). Thus, the upper surface of the mount substrate 16 and the quartz crystal resonator 13 are covered by the cap 12. For example, the cap has a structure such that an Au layer is formed, by plating, on a body made of Cu.

(Operational Effects)

With the quartz crystal resonator 13 structured as described above, variation of the excitation frequency can be suppressed. To be more specific, the quartz crystal device described in Patent Document 1 has, when viewed from above, the quartz crystal resonator 502, and the outer electrodes and the excitation electrodes, which are disposed on the quartz crystal resonator 502, each have a structure that is line-symmetric with respect to the straight line L500. Therefore, the quartz crystal resonator 502 is joined to the base 504 at a position such that the quartz crystal resonator 502 is line-symmetric with respect to the straight line L500. Accordingly, a stress due to an impact is large on the straight line L500, which is at the middle of the joint. The center of each excitation electrode is located on the straight line L500, and a large stress is applied to the center of the excitation electrode. As a result, the excitation frequency of the quartz crystal device 500 varies.

In the quartz crystal resonator 13, the intersecting point P of the diagonal lines of a quadrangle formed by the connection portions 15c to 15f is located on the positive side (right side) of the Z' axis relative to the X axis and is displaced from the X axis. Accordingly, generation of a large stress on the X axis (corresponding to the straight line L500) is suppressed, and generation of a large stress at the origin O is suppressed. As a result, generation of a large stress at the intersecting point of the diagonal lines of each of the excitation electrodes 20 and 22 is suppressed, and variation of the excitation frequency is suppressed.

Moreover, with the quartz crystal resonator 13, variation of the excitation frequency can be suppressed also for the following reason. To be more specific, the intersecting point P is located on the negative side (back side) of the X axis relative to the Z' axis and is displaced from the Z' axis. Accordingly, generation of a large stress on the Z' axis is suppressed, and generation of a large stress at the origin O is suppressed. As a result, generation of a large stress at the intersecting point of the diagonal lines of each of the excitation electrodes 20 and 22 is suppressed, and variation of the excitation frequency is suppressed.

(First Modification)

Figure 5:
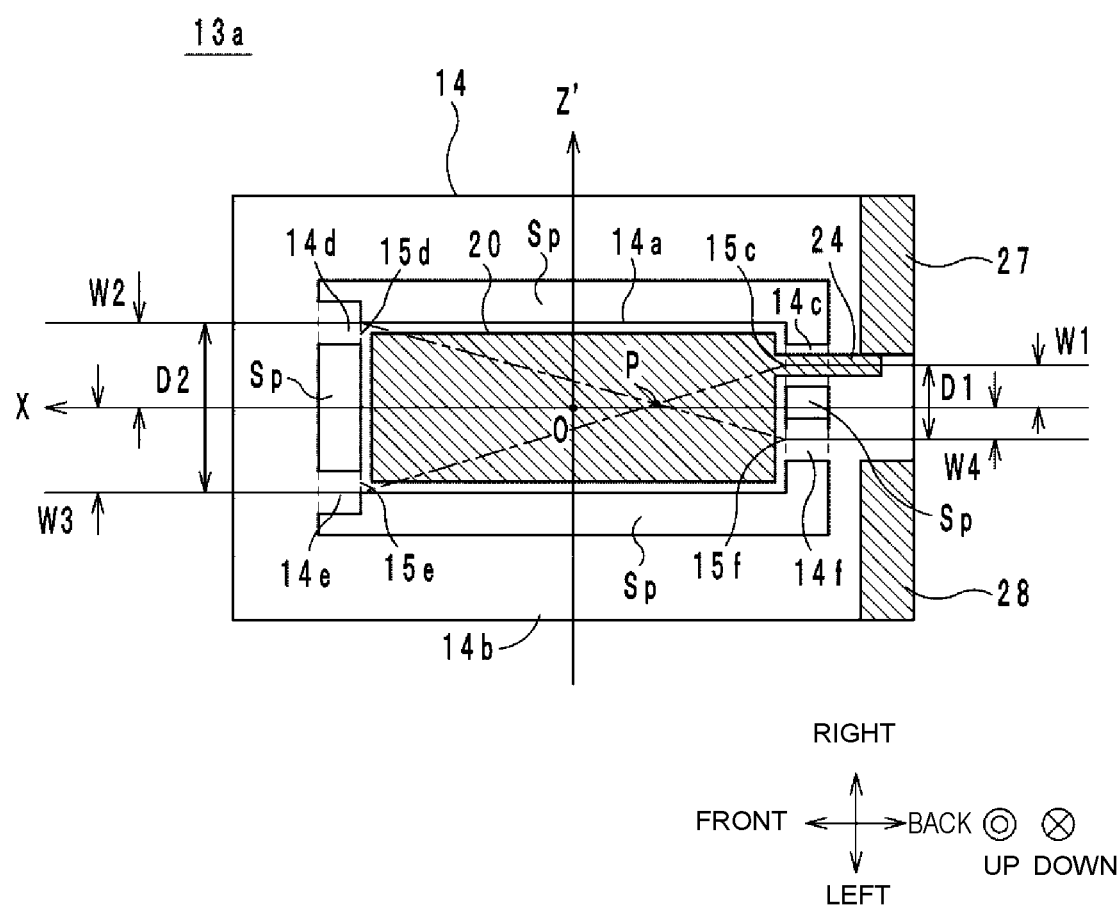

Hereinafter, a quartz crystal resonator 13a according to a first modification will be described with reference to a drawing. FIG. 5 is a top view of the quartz crystal resonator 13a.

The quartz crystal resonator 13a differs from the quartz crystal resonator 13 in the arrangement of the coupling portions 14c to 14f. To be more specific, when viewed from above, the coupling portions 14d and 14e are respectively coupled to the right-front corner and the left-front corner of the vibration portion 14a. Description of the coupling portions 14c and 14f of the quartz crystal resonator 13a, which are the same as the coupling portions 14c and 14f of the quartz crystal resonator 13, will be omitted. With this structure, D2 is further larger than D1.

With the quartz crystal resonator 13a, variation of the excitation frequency is suppressed in the same way as with the quartz crystal resonator 13.

(Second Modification)

Figure 6:
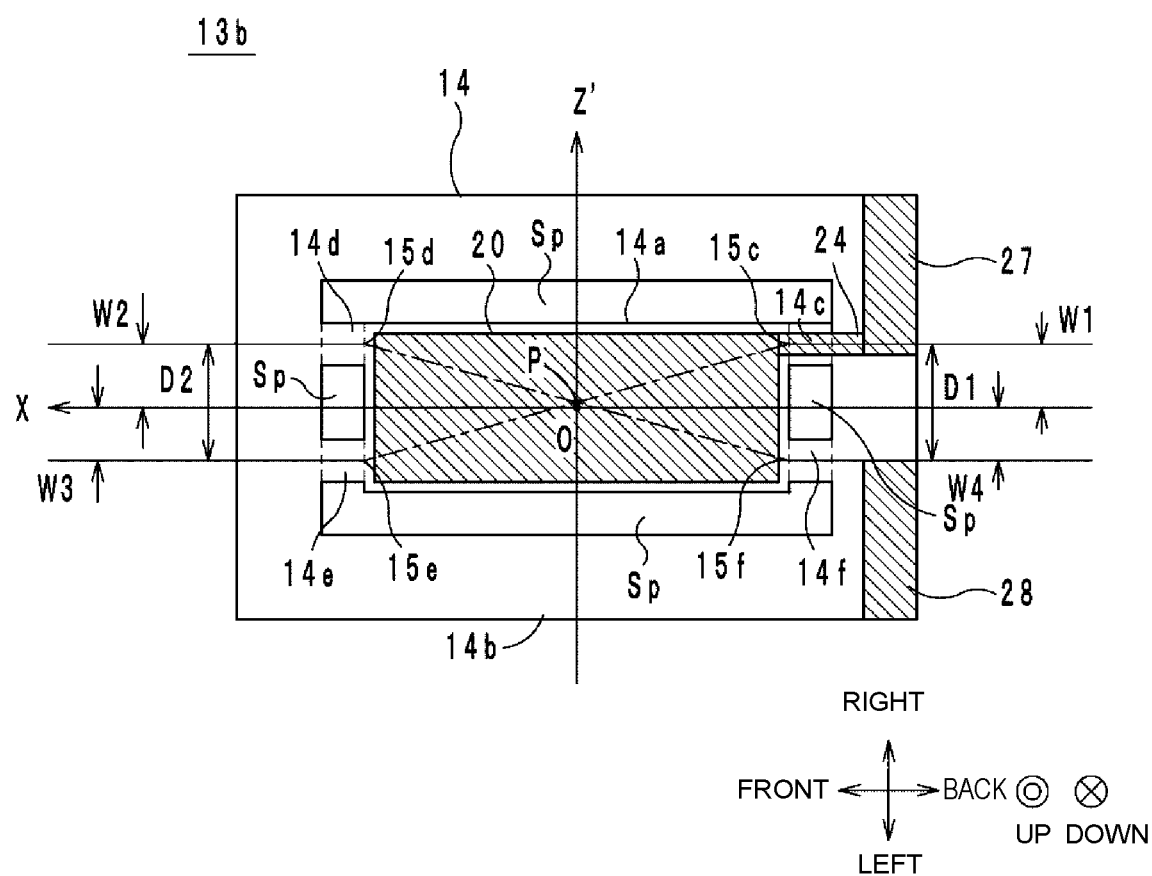
FIG. 6 is a top view of a quartz crystal resonator 13b.

Hereinafter, a quartz crystal resonator 13b according to a second modification will be described with reference to a drawing. FIG. 6 is a top view of the quartz crystal resonator 13b.

The quartz crystal resonator 13b differs from the quartz crystal resonator 13 in the relationship between D1 and D2. To be more specific, in the quartz crystal resonator 13b, D1=D2 is satisfied. Thus, the intersecting point P is located on the Z' axis.

With the quartz crystal resonator 13b having the structure described above, variation of the excitation frequency is suppressed in the same way as with the quartz crystal resonator 13.

(Third Modification)

Figure 7:
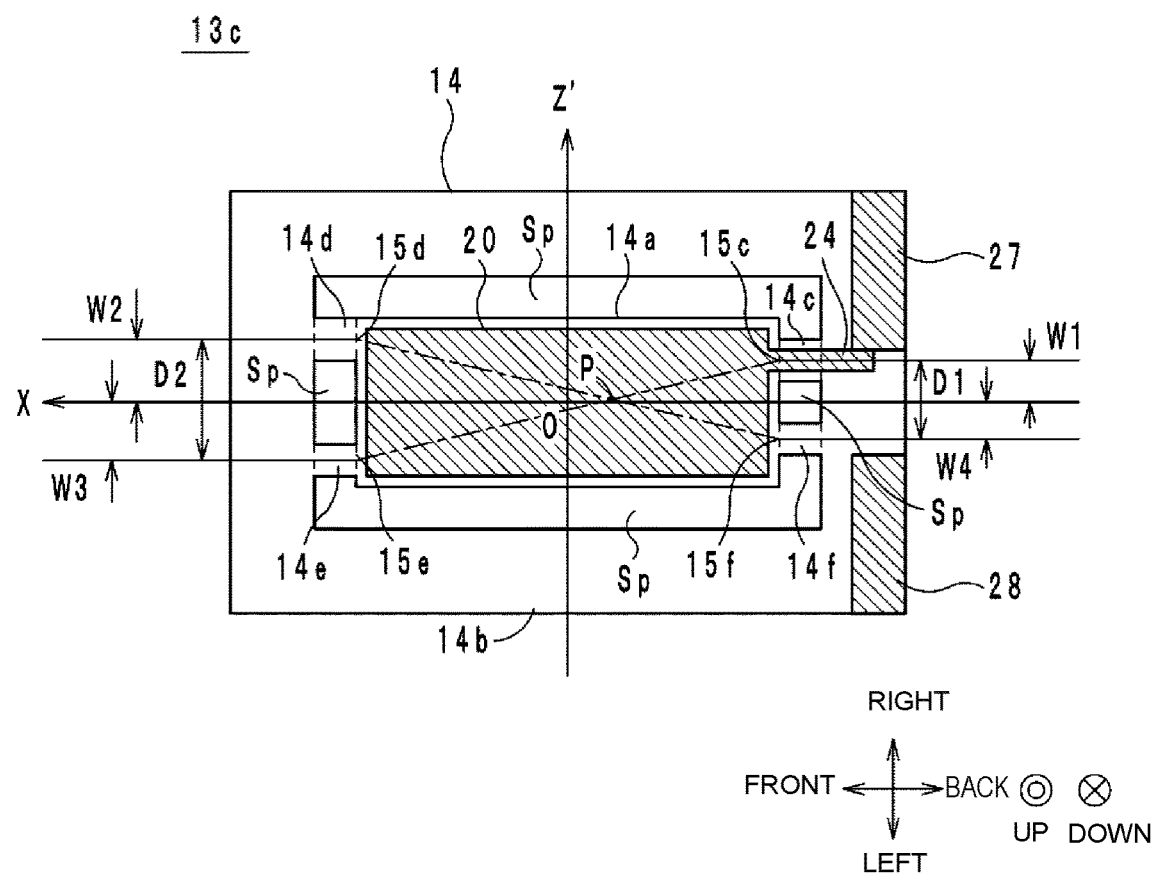
FIG. 7 is a top view of a quartz crystal resonator 13c.

Hereinafter, a quartz crystal resonator 13c according to a third modification will be described with reference to a drawing. FIG. 7 is a top view of the quartz crystal resonator 13c.

The quartz crystal resonator 13c differs from the quartz crystal resonator 13 in the line width of the coupling portions 14e and 14f. To be more specific, the line width of each of the coupling portions 14e and 14f is smaller than the line width of each of the coupling portions 14c and 14d. The term "line width" refers to the width of each of the coupling portions 14c to 14f in a direction (the left-right direction) perpendicular to the direction (the front-back direction) in which the coupling portions 14c to 14f extend when viewed from above.

With the quartz crystal resonator 13c having the structure described above, variation of the excitation frequency is suppressed in the same way as with the quartz crystal resonator 13.

(Other Embodiments)

A quartz crystal resonator and a quartz crystal resonator unit according to the present invention are not limited to the quartz crystal resonators 13 and 13a to 13c and the quartz crystal resonator unit 10 and may be modified within the spirit and scope of the present invention.

The structures of the quartz crystal resonators 13 and 13a to 13c may be used in any appropriate combination.

The quartz crystal blank 14, which is an AT-cut quartz crystal blank in the above description, may be a BT-cut quartz crystal blank that vibrates in a thickness shear mode in a similar way.

The quartz crystal blank 14 need not be a single quartz crystal plate. To be more specific, as long as the vibration portion 14a is a single quartz crystal plate, the frame portion 14b and the coupling portions 14c to 14f need not be a quartz crystal plate.

The vibration portion 14a of the quartz crystal blank 14 may have a so-called mesa structure. That is, the thickness of the outer edge of the vibration portion 14a may be smaller than the thickness of a portion of the vibration portion 14a excluding the outer edge. In this case, leakage of vibration from the vibration portion 14a can be effectively suppressed.

The intersecting point P may be located on the positive side of the X axis relative to the Z' axis. The intersecting point P may be located on the negative side of the Z' axis relative to the X axis.

The intersecting point P may be located on the X axis and located on the positive side or the negative side of the X axis relative to the Z' axis. The intersecting point P may be located on the Z' axis and located on the positive side or the negative side of the Z' axis relative to the X axis.

When viewed from above, the connection portions 15c and 15d may be located on the long edge of the vibration portion 14a on the right side. When viewed from above, the connection portions 15e and 15f may be located on the long edge of the vibration portion 14a on the left side.

As described above, the present invention is applicable to a quartz crystal resonator and a quartz crystal resonator unit, and, in particular, has an advantage in that variation of the excitation frequency can be suppressed.

REFERENCE SIGNS LIST 10 quartz crystal resonator unit
12 cap
13, 13a to 13c quartz crystal resonator
14 quartz crystal blank
14a vibration portion
14b frame portion
14c to 14f coupling portion
15c to 15f connection portion
16 mount substrate
17 substrate body
20, 22 excitation electrode
24, 26 extension electrode
27, 28, 32, 34, 36, 38 outer electrode
29, 30 mount electrode
O origin
P intersecting point
Sp space

The invention claimed is:

1. A quartz crystal resonator comprising:
a substrate that is a quartz crystal plate having a first main surface and a second main surface, the substrate including a vibration portion, a frame portion that is separated from the vibration portion and surrounds the vibration portion when viewed in a direction normal to the first main surface, and first to fourth coupling portions that couple the vibration portion and the frame portion to each other;
a first excitation electrode on the first main surface in the vibration portion; and
a second excitation electrode on the second main surface in the vibration portion,
wherein the vibration portion has a rectangular shape having a first edge, a second edge, a third edge, and a fourth edge, the third and fourth edges being perpendicular to the first and second edges when viewed in the normal direction,
wherein, when an intersecting point of diagonal lines of the vibration portion when viewed in the normal direction is defined as an origin, a first straight line that passes through the origin, that is parallel to the first edge, and that has a positive side on which the third edge is located is defined as a z axis, and a second straight line that passes through the origin, that is parallel to the third edge, and that has a positive side on which the second edge is located is defined as an x axis, the first coupling portion couples the vibration portion and the frame portion in a first region on the positive side of the z axis and the negative side of the x axis when viewed in the normal direction, the second coupling portion couples the vibration portion and the frame portion in a second region on the positive side of the z axis and the positive side of the x axis when viewed in the normal direction, the third coupling portion couples the vibration portion and the frame portion in a third region on the negative side of the z axis and the positive side of the x axis when viewed in the normal direction, the fourth coupling portion couples the vibration portion and the frame portion in a fourth region on the negative side of the z axis and the negative side of the x axis when viewed in the normal direction, wherein where the first to fourth coupling portions are respectively connected to the vibration portion are defined as first to fourth connection portions, and wherein an intersecting point of diagonal lines of a quadrangle formed by the first to fourth connection portions is located on the positive side or the negative side of the z axis relative to the x axis when viewed in the normal direction, or, the intersecting point of the diagonal lines of the quadrangle formed by the first to fourth connection portions is located on the positive side or the negative side of the x axis relative to the z axis when viewed in the normal direction.

2. The quartz crystal resonator according to claim 1, wherein a length of each of the first edge and the second edge is smaller than a length of each of the third edge and the fourth edge.

3. The quartz crystal resonator according to claim 2, wherein the first connection portion and the fourth connection portion are located on the first edge.

4. The quartz crystal resonator according to claim 3, wherein the second connection portion and the third connection portion are located on the second edge.

5. The quartz crystal resonator according to claim 4, wherein $W1 \neq W4$ and/or $W2 \neq W3$, where $W1$ is a distance between the first connection portion and the x axis, $W2$ is a distance between the second connection portion and the x axis, $W3$ is a distance between the third connection portion and the x axis, and $W4$ is a distance between the fourth connection portion and the x axis.

6. The quartz crystal resonator according to claim 5, wherein $W1 \neq W4$ and $W2 \neq W3$.

7. The quartz crystal resonator according to claim 5, wherein $W1 > W4$ and $W2 > W3$.

8. The quartz crystal resonator according to claim 4, wherein $D1 \neq D2$, where $D1$ is a distance between the first connection portion and the fourth connection portion, and $D2$ is a distance between the second connection portion and the third connection portion.

9. The quartz crystal resonator according to claim 8, wherein $D1 < D2$.

10. The quartz crystal resonator according to claim 8, wherein $D1 > D2$.

11. The quartz crystal resonator according to claim 5, wherein $D1 \neq D2$, where $D1$ is a distance between the first connection portion and the fourth connection portion, and $D2$ is a distance between the second connection portion and the third connection portion.

12. The quartz crystal resonator according to claim 11, wherein $D1 < D2$.

13. The quartz crystal resonator according to claim 11, wherein $D1 > D2$.

14. The quartz crystal resonator according to claim 4, wherein $D1 = D2$, where $D1$ is a distance between the first connection portion and the fourth connection portion, and $D2$ is a distance between the second connection portion and the third connection portion.

15. The quartz crystal resonator according to claim 5, wherein $D1 = D2$, where $D1$ is a distance between the first connection portion and the fourth connection portion, and $D2$ is a distance between the second connection portion and the third connection portion.

16. The quartz crystal resonator according to claim 1, wherein the substrate is a single quartz crystal plate.

17. The quartz crystal resonator according to claim 1, wherein the quartz crystal plate is an AT-cut quartz crystal.

18. The quartz crystal resonator according to claim 1, wherein a first line width of each of the third and fourth coupling portions is smaller than a second line width of each of the first and second coupling portions.

19. The quartz crystal resonator according to claim 1, further comprising:

a first outer electrode on the second main surface in the frame portion;

a second outer electrode on the second main surface in the frame portion;

a first extension electrode on the first main surface of the substrate and having a first end portion and a second end portion, the first extension electrode passing through one of the first to fourth coupling portions and electrically connected to the first excitation electrode at the first end portion and electrically connected to the first outer electrode at the second end portion; and a second extension electrode on the second main surface of the substrate and having a third end portion and a fourth end portion, the second extension electrode passing through one of the first to fourth coupling portions and electrically connected to the second excitation electrode at the third end portion and electrically connected to the second outer electrode at the fourth end portion.

20. A quartz crystal resonator unit comprising:

a mount substrate that has a third main surface and a fourth main surface;

the quartz crystal resonator according to claim 18 mounted on the mount substrate so that the second main surface and the third main surface face each other; and a cap that covers the third main surface.

* * * * *